United States Patent
Ausman et al.

(10) Patent No.: US 7,973,533 B2
(45) Date of Patent: Jul. 5, 2011

(54) IN-CIRCUIT TESTING FOR INTEGRITY OF SOLID-STATE SWITCHES

(75) Inventors: Marc Ausman, Albuquerque, NM (US); Kevin DeVries, Albuquerque, NM (US); Jake Dostal, Albuquerque, NM (US)

(73) Assignee: Vertical Power, Inc., Albuquerque, NM (US)

( * ) Notice: Subject to any disclaimer, the term of this patent is extended or adjusted under 35 U.S.C. 154(b) by 747 days.

(21) Appl. No.: 12/038,693

(22) Filed: Feb. 27, 2008

(65) Prior Publication Data
US 2009/0212975 A1    Aug. 27, 2009

(51) Int. Cl.
G01R 31/02 (2006.01)
G01R 31/327 (2006.01)
G01R 31/26 (2006.01)

(52) U.S. Cl. .................................. 324/415; 324/762.09

(58) Field of Classification Search .................. 324/415, 324/762.09
See application file for complete search history.

(56) References Cited

U.S. PATENT DOCUMENTS

| | | |
|---|---|---|
| 3,581,276 A | 5/1971 | Newman |
| 4,127,847 A | 11/1978 | Stifter |
| 4,191,347 A | 3/1980 | Fueyo |
| 4,243,970 A | 1/1981 | Hardee et al. |
| 4,409,635 A | 10/1983 | Kraus |
| 4,452,207 A | 6/1984 | Moore, Jr. |
| 4,598,890 A | 7/1986 | Herzog et al. |
| 4,649,484 A | 3/1987 | Herzog et al. |
| 4,729,102 A | 3/1988 | Miller |
| 4,757,249 A | 7/1988 | Farber |
| 4,811,255 A | 3/1989 | Kelly |
| 5,001,638 A | 3/1991 | Zimmerman |
| 5,082,208 A | 1/1992 | Matich |
| 5,224,006 A | 6/1993 | MacKenzie et al. |
| 5,353,657 A | 10/1994 | Bainbridge, III |
| 5,381,296 A | 1/1995 | Ekelund et al. |
| 5,497,072 A | 3/1996 | LeComte et al. |
| 5,536,980 A | 7/1996 | Kawate et al. |
| 5,691,869 A | 11/1997 | Engel et al. |
| 5,703,463 A | 12/1997 | Smith |
| 5,723,915 A | 3/1998 | Maher et al. |
| 5,767,724 A | 6/1998 | Steglich |
| 5,818,673 A | 10/1998 | Matsumaru et al. |
| 5,864,221 A | 1/1999 | Downs et al. |
| 5,913,492 A | 6/1999 | Durandeau et al. |
| 5,941,222 A | 8/1999 | Braly |
| 6,031,743 A | 2/2000 | Carpenter et al. |
| 6,114,672 A | 9/2000 | Iwasaki et al. |

(Continued)

OTHER PUBLICATIONS

U.S. Appl. No. 60/853,712, filed Oct. 23, 2006, Marc Ausman.

(Continued)

Primary Examiner — Roberto Velez
(74) Attorney, Agent, or Firm — V. Gerald Grafe

(57) ABSTRACT

A switching and fault detection circuit comprises two controllable switches capable of coupling a power source to a load. A controller can control the switches and test them for faults, and a voltage sensor can read the output voltage going to the load. Dual-redundant switches and fault detection circuitry can provide correct operation if one should fail. Control and feedback logic can determine if each of the solid-state switches is operating correctly during the power-on and power-off cycles and can also check for a fail-open condition during normal operations. If it is determined that a solid switch has failed open or closed, a fault can be generated.

21 Claims, 2 Drawing Sheets

U.S. PATENT DOCUMENTS

| | | | |
|---|---|---|---|
| 6,157,091 | A | 12/2000 | Yoshida et al. |
| 6,325,333 | B1 | 12/2001 | Najmabadi et al. |
| 6,346,892 | B1 | 2/2002 | DeMers et al. |
| 6,421,214 | B1 | 7/2002 | Packard et al. |
| 6,556,902 | B2 | 4/2003 | Ing et al. |
| 6,606,228 | B1 | 8/2003 | Potter, IV |
| 6,639,522 | B2 | 10/2003 | Derderian |
| 6,664,945 | B1 | 12/2003 | Gyde et al. |
| 6,700,482 | B2 | 3/2004 | Ververs et al. |
| 6,744,650 | B2 | 6/2004 | Mahlein et al. |
| 6,754,567 | B2 | 6/2004 | Bernard |
| 6,824,099 | B1 | 11/2004 | Jones |
| 6,842,672 | B1 | 1/2005 | Straub et al. |
| 6,859,688 | B1 | 2/2005 | Orf et al. |
| 6,917,186 | B2 * | 7/2005 | Klippel et al. ............... 323/268 |
| 6,927,963 | B2 | 8/2005 | Potter, IV |
| 6,943,558 | B2 | 9/2005 | Hale et al. |
| 6,950,764 | B2 | 9/2005 | Ennis et al. |
| 6,952,335 | B2 | 10/2005 | Huang et al. |
| 7,021,587 | B1 | 4/2006 | Younkin |
| 7,039,518 | B2 | 5/2006 | Ingram et al. |
| 7,102,252 | B2 | 9/2006 | Bertrand |
| 7,133,267 | B2 | 11/2006 | Potter |
| RE39,710 | E | 7/2007 | Young et al. |
| 2002/0035415 | A1 | 3/2002 | Gardner |
| 2002/0035416 | A1 | 3/2002 | De Leon |
| 2003/0048203 | A1 | 3/2003 | Clary |
| 2004/0156154 | A1 | 8/2004 | Lazarovich et al. |
| 2005/0187677 | A1 | 8/2005 | Walker |
| 2005/0248361 | A1 * | 11/2005 | O'Gorman et al. ........... 324/772 |
| 2007/0120694 | A1 | 5/2007 | Lindsey |
| 2010/0076630 | A1 | 3/2010 | Vian |

OTHER PUBLICATIONS

U.S. Appl. No. 11/311,060, filed Dec. 19, 2005, Marc Ausman.
U.S. Appl. No. 11/875,813, filed Oct. 19, 2007, Marc Ausman.
U.S. Appl. No. 11/875,815, filed Oct. 19, 2007, Marc Ausman.
U.S. Appl. No. 11/875,816, filed Oct. 19, 2007, Marc Ausman.
U.S. Appl. No. 11/875,818, filed Oct. 19, 2007, Marc Ausman.
U.S. Appl. No. 11/875,819, filed Oct. 19, 2007, Marc Ausman.

* cited by examiner

IN-CIRCUIT TESTING FOR INTEGRITY OF SOLID-STATE SWITCHES

FIELD OF THE INVENTION

The present invention relates to a fault detection and switching circuit for use with a power control device to detect an abnormal open or abnormal closed state in the power control device, and is useful in applications such as facilitating safe aircraft control.

BACKGROUND

Solid state power switches used as power control devices tend to fail in shorted states, which is often unacceptable in power switching applications. Various fault detection circuits for detecting such short circuits in power switching applications are known. In one such technique, a second solid state power switch device is used to turn off the current when a primary solid state power switch fails to respond. This method is not failsafe, since there is no way to know if one of the switches has failed closed.

In another technique, a mechanical fuse or circuit breaker is added in series with the solid state power switch device. This technique is based on the assumption that when the solid state power switch device is shorted, so is the load. This is not always the case. Therefore, this technique fails to detect a shorted solid state power switch where the power switch is shorted but the load is not.

In another technique, a thermal fuse is placed in close proximity to a power control device such that the fuse opens the circuit when the solid state power switch carries the full load current, thereby overheating the fuse, or in the event that the temperature of the power switch exceeds the fuse's temperature rating. This technique is effective even where the power switch is shorted but the load is not. However, this technique is not failsafe in that it requires the power control device itself to exceed the fuse's temperature or current rating in order for the circuit to be opened.

In another technique, the output current is compared with the switch control voltage, and if there is output current but the switch control voltage is zero, then a thermal fuse is heated until it opens the circuit. However, this technique must be carefully adapted for different size loads and does not provide user-resettable capabilities. Examples of current techniques are disclosed in various patents, such as those described below, each of which is incorporated herein by reference. The current techniques, however, do not provide a fault detection and switching circuit and method of operation for use with a power control device to detect an abnormal open or abnormal closed state in the power control device.

U.S. Pat. No. 5,224,006, "Electronic circuit breaker with protection against sputtering arc faults and ground faults", discloses a circuit breaker that bandwidth limits a sensed rate of change of current, di/dt, in the neutral conductor of a protected electrical system and fullwave rectifies the bandwidth limited di/dt signal for comparison with an instantaneous trip reference signal.

U.S. Pat. No. 5,381,296, "Short circuit limiting protector", discloses a current limiting short-circuiting protector which utilizes an electronic and thermal feedback principle for achieving precise and rapid release of the protector, which can be readily reset.

U.S. Pat. No. 5,536,980, "High voltage, high current switching apparatus", discloses a high voltage, high current DC switch having a single pole, double throw relay and a solid state power switch such as an IGBT or MOSFET transistor.

U.S. Pat. No. 5,691,869, "Low cost apparatus for detecting arcing faults and circuit breaker incorporating same", discloses an analog arcing detector and a circuit breaker incorporating such a detector that provides a variable response time to arcing faults based upon the amplitude of the arcing current.

U.S. Pat. No. 5,703,463, "Methods and apparatus for protecting battery cells from overcharge", discloses a method and apparatus for protecting at least one battery cell from overcharge that utilizes a combination of at least one MOSFET switch and a separate fail-safe element such as a fuse or circuit breaker.

U.S. Pat. No. 5,767,724, "Electronic clamping circuit", discloses an electronic clamping circuit that includes a pair of diodes connected in series, both having the same bias, which are shunted across a feedback path of a transimpedance amplifier circuit.

U.S. Pat. No. 5,818,673, "Electric power distribution system having fault bypass feature", discloses an electric power distribution system comprising: a plurality of electric power distribution portions for distributing electric power to a plurality of various loads; and a power supply portion connected to at least any one of the plural electric power distribution portions such that the plural electric power distribution portions are able to supply electric power through at least two systems of electric lines.

U.S. Pat. No. 6,031,743, "Fault isolation in a redundant power converter", discloses a system for isolating faults in a redundant power converter including a first switch at an input of the redundant power converter for protecting the redundant power converter from a high input voltage, and a second switch coupled within the redundant power converter prior to an output capacitor, wherein efficiency of fault isolation is improved.

U.S. Pat. No. 6,114,672, "PTC-element, protective device and electric circuit board", discloses a PTC-element to be used as a protective device against overcurrent or overvoltage, of which the volume resistivity does not substantially differ before and after a high temperature processing, such as reflowing of solder, and can be preserved even after having been subjected to repeated tripping, which contains a non-conductive crystalline polymer and a particulate conductor material dispersed in the non-conducting crystalline polymer, wherein the particulate conductor material includes electro-conductive particles having irregular surface contours.

U.S. Pat. No. 6,157,091, "Power supplying apparatus for a vehicle and an intensive wiring apparatus", discloses a specific loop wiring topology intended to facilitate determination of the location of short circuit abnormalities in a power supply system.

U.S. Pat. No. 6,421,214, "Arc fault or ground fault detector with self-test feature", discloses a self-testing arc fault or ground fault detector that includes arc fault detecting circuitry and components. The detector includes a testing circuit which tests at least part of the circuitry and components and generates a recurring signal when the test completes successfully. If the test does not complete successfully, the signal is lost. This loss of signal is signaled by an indicator connected to the testing circuit. In one version, the loss of signal activates a circuit interrupter which disconnects the load side of the detector from the line side.

U.S. Pat. No. 6,606,228, "Fault detection circuit for use with a power control device", discloses a fault detection circuit that includes a controllable switch coupling a power source to a load. Control circuitry determines if the switch is in the proper conduction state based on a switch control signal and a signal indicative of power delivered to the load. If the switch is determined as improperly closed (conducting), the control circuitry diverts energy delivered to the load through fuse circuitry, thereby blowing a fuse and decoupling the load from the power source.

U.S. Pat. No. 6,744,650, "Method for controlling a matrix converter", discloses a method for controlling a matrix converter which includes nine bi-directional circuit-breakers arranged in a 3 by 3 switch matrix.

U.S. Pat. No. 6,917,186, "Monitoring and control for power electronic system", discloses a control method and arrangement that monitors the condition and operating parameters of a power electronic system having power electronic devices and responds to various detected abnormalities to optimize operation of the power electronic system.

U.S. Pat. No. 6,927,963, "Fault detection circuit for use with a power control device", discloses a fault detection circuit that includes a controllable switch coupling a power source to a load. Control circuitry is provided that determines if the switch is in the proper conduction state based on a switch control signal and a signal indicative of power delivered to the load. If the switch is determined as improperly closed (conducting), the control circuitry diverts energy delivered to the load through fuse circuitry, thereby blowing a fuse and decoupling the load from the power source.

U.S. Pat. No. 6,943,558, "System and method for remotely detecting electric arc events in a power system", discloses a system for remotely detecting and locating damaged conductors.

U.S. Pat. No. 6,950,764, "Arrangements to detect and respond to disturbances in electrical power systems", discloses a control arrangement and method for detecting and responding to disturbances in electrical power systems. When an integration based on a comparison of actual voltage of a source and a reference voltage exceeds a predetermined value, the source is considered unreliable.

U.S. Pat. No. 6,952,335, "Solid-state DC circuit breaker", discloses a high-speed, solid-state circuit breaker capable of interrupting high DC currents without generating an arc. The high-speed, solid-state DC circuit breaker uses an emitter turn-off (ETO) thyristor as the switch.

U.S. Pat. No. 7,102,252, "Multi-function solid-state switch", discloses a dual solid state switch architecture with a plurality of control/monitor ports, selected ones of which are used to control the operation of a pair of power MOSFETs current flow paths through which are coupled to prescribed ones of a plurality of input/output ports that are adapted to be coupled to a circuit path containing a load and an AC or DC power source. Selected others of the control/monitor ports are used to monitor current delivered to the load. A leakage current by-pass resistor is connected between selected input/output ports, to which a neon tube may be connected for indicating the switching on of an AC source. This resistor serves to provide a bypass path for leakage current through the MOSFETs, so as to prevent the neon tube from being erroneously illuminated, when the MOSFETs have been turned off.

U.S. Pat. No. 7,133,267, "Arc detection circuit", discloses an arc detector comprising a voltage generator for detecting a voltage and an integrator for integrating said voltage with respect to time and generating an output signal corresponding to said integration.

U.S. Pat. RE39,710, "System for providing assured power to a critical load", discloses a power system for supplying uninterrupted electrical power to one or more critical loads, comprising one or more fuel cell power plants to provide one substantially continuous source of power, and a utility grid to provide another source of power.

U.S. Patent Publication 20040156154, "Arc fault detection for SSPC based electrical power distribution systems", discloses an apparatus and a method for detecting arc faults in an electrical power distribution system of a vehicle. The apparatus includes: a load current input arranged to obtain a measurement of current being supplied to a load via a solid state power switching device of the electrical power distribution system; and an arc fault detector arranged to compare the measured load current with a load signature, the load signature being a function of characteristics of the load being supplied current via the solid state power switching device and operating conditions of the solid state power switching device.

Modern aircraft typically have many critical systems that are electrically controlled. Failure of a power switch can lead to hazardous conditions, and so the ability to monitor power switching systems and detect faults can be especially important in aircraft applications. The following patent applications, each of which is incorporated herein by reference, describe various aircraft instrumentation and operation methods and apparatuses in connection with the present invention can be useful:

U.S. provisional application 60/853,712, filed Oct. 23, 2006;
U.S. patent application Ser. No. 11/311,060, filed Dec. 19, 2005;
U.S. patent application Ser. No. 11/875,813, filed Oct. 19, 2007, Aircraft Emergency Handling;
U.S. patent application Ser. No. 11/875,815, filed Oct. 19, 2007, Backup Electrical Power System for Solid-State Aircraft Power Distribution Systems;
U.S. patent application Ser. No. 11/875,816, filed Oct. 19, 2007, Aircraft Electrical System Evaluation;
U.S. patent application Ser. No. 11/875,818, filed Oct. 19, 2007, Aircraft Exhaust Gas Temperature Monitor;
U.S. patent application Ser. No. 11/875,819, filed Oct. 19, 2007, Variable Speed Flap Retraction and Notification.

Accordingly, there is a need for methods and apparatuses that provide for testing of power switches without requiring destructive elements such as fuses, and that allow switch integrity testing before power activation and during operation.

SUMMARY OF THE INVENTION

The present invention provides methods and apparatuses that provide for testing of power switches without requiring destructive elements such as fuses, and that allow switch integrity testing before power activation and during operation.

An example embodiment of the present invention comprises a method of testing first and second switches, wherein the first switch has first and second terminals and a control input, and wherein the second switch has first and second terminals and a control input, and wherein the second terminal of the first switch is in communication with the first terminal of the second switch, and wherein the first terminal of the first switch is adapted to be placed in communication with a power supply, and wherein the second terminal of the second switch is adapted to be placed in communication with a load, using a controller that is in communication with the control input of the first switch and the control input of the second switch, comprising the following steps performed in any order: (a) Causing the controller to direct the first switch to open and to direct the second switch to close; and causing the controller to sense the presence of power at the second terminal of the second switch, and, if power is present at the second terminal of the second switch, to indicate a fault; and (b) Causing the controller to direct the second switch to close, and causing the controller to direct the first switch to open; and causing the controller to sense the presence of power at the second terminal of the second switch, and, if power is present at the second terminal of the second switch, to indicate a fault. Such an example can further comprise causing the controller to direct the first switch to close and to direct the second switch to close, and causing the controller to sense power at the second terminal of the second switch and, if power is not present, to indicate a fault.

An example embodiment of the present invention can comprise a method of testing first and second switches, wherein the first switch has first and second terminals and a control input and a status output, and wherein the second switch has first and second terminals and a control input, and wherein the second terminal of the first switch is in communication with the first terminal of the second switch, and wherein the first terminal of the first switch is adapted to be placed in communication with a power supply, and wherein the second terminal of the second switch is adapted to be placed in communication with a load, using a controller that is in communication with the control input of the first switch and the control input of the second switch and the status output of the first switch, comprising the following steps performed in any order: (a) Causing the controller to direct the first switch to open and to direct the second switch to close; and causing the controller to sense the presence of power at the second terminal of the second switch, and, if power is present at the second terminal of the second switch, to indicate a fault; (b) Causing the controller to direct the second switch to close, and causing the controller to direct the first switch to open; and causing the controller to sense the presence of power at the second terminal of the second switch, and, if power is present at the second terminal of the second switch, to indicate a fault; and (c) Causing the controller to sense the status output of the first switch and, if a fault is indicated by the status output of the first switch, to indicate a fault. Such an example embodiment, where the second switch has a status output, and where the controller is in communication with the status output of the second switch, can further comprise causing the controller to sense the status output of the second switch and, if a fault is indicated by the status output of the second switch, to indicate a fault. Such an example embodiment can further comprise causing the controller to direct the first switch to close and to direct the second switch to close, and causing the controller to sense power at the second terminal of the second switch and, if power is not present, to indicate a fault.

An example embodiment of the present invention can comprise a method of controlling power communication from a power supply to a load, comprising: (a) Providing a first switch; (b) Providing a second switch, wherein the first and second switches are connected in series between the power supply and the load; (c) Accepting an input indicating that power is to be communicated to the load; (d) Closing the first switch and opening the second switch, and, if power is present at the load, indicating a fault; (e) Opening the first switch and closing the second switch, and, if power is present at the load, indicating a fault; (f) Closing the first switch and closing the second switch, and, if power is not present at the load, indicating a fault. Such an example embodiment, where the first switch has a status output, and where the second switch has a status output, can further comprise indicating a fault if the status output of the first switch indicates a fault or if the status output of the second switch indicates a fault. Such an example embodiment can further comprise accepting an input indicating that power is not to be communicated to the load, opening the first switch and opening the second switch, and, if power is present at the load, indicating a fault.

An example embodiment of the present invention can comprise a power switching apparatus with integrity testing, comprising: (a) A first power switch, having first and second terminals and a control input, capable of communicating power from the first terminal to the second terminal responsive to a signal on the control input, with the first terminal of the first switch adapted to be placed in communication with a power supply; (b) A second power switch, having first and second terminals and a control input, capable of communicating power from the first terminal to the second terminal responsive to a signal on the control input, with the first terminal of the second switch in communication with the second terminal of the first switch, and with the second terminal adapted to be placed in communication with a load; (c) A controller, in communication with the control input of the first switch and with the control input of the second switch, and adapted to test the integrity of the first and second switches using the methods described herein. Such an example embodiment can include the controller having an input terminal, and initiating the integrity test responsive to a signal on the control input directing the controller to perform an integrity test. Such an example embodiment can include an embodiment where the controller has an input terminal, and initiates the integrity test responsive to a signal on the control input directing the controller to place the power supply in communication with the load, and performs the integrity test before placing the power supply in communication with the load.

An example embodiment of the present invention can comprise a power switching apparatus with integrity testing, comprising: (a) A first power switch, having first and second terminals and a control input and a status output, capable of communicating power from the first terminal to the second terminal responsive to a signal on the control input, with the first terminal of the first switch adapted to be placed in communication with a power supply; (b) A second power switch, having first and second terminals and a control input, capable of communicating power from the first terminal to the second terminal responsive to a signal on the control input, with the first terminal of the second switch in communication with the second terminal of the first switch, and with the second terminal adapted to be placed in communication with a load; (c) A controller, in communication with the control input of the first switch and with the control input of the second switch and with the status output of the first switch, and adapted to test the integrity of the first and second switches using the methods described herein.

An example embodiment of the present invention can comprise a power switching apparatus with integrity testing, comprising: (a) A first power switch, having first and second terminals and a control input and a status output, capable of communicating power from the first terminal to the second terminal responsive to a signal on the control input, with the first terminal of the first switch adapted to be placed in communication with a power supply; (b) A second power switch, having first and second terminals and a control input and a status output, capable of communicating power from the first terminal to the second terminal responsive to a signal on the control input, with the first terminal of the second switch in communication with the second terminal of the first switch, and with the second terminal adapted to be placed in communication with a load; (c) A controller, in communication with the control input of the first switch and with the control input of the second switch and with the status output of the first switch, and adapted to test the integrity of the first and second switches using the methods described herein.

Several of the example embodiments can include an embodiment where the first and second switches comprise a MOSFET with built-in circuit protection. Several of the example embodiments can include an embodiment where the controller comprises a microprocessor. Such an example embodiment can include an embodiment where the first and second switches comprise a MOSFET with built-in circuit protection. Several of the example embodiments can include an embodiment where the controller comprises a microprocessor. Several of the example embodiments can include an embodiment where a predetermined amount of time is allowed to elapse after directing the first or second switch to open before causing the controller to sense the presence of power at the second terminal of the second switch.

An example embodiment of the present invention can comprise an aircraft power switching apparatus, comprising a power switch apparatus as described herein, in communication with an electrical power source on board the aircraft, and in communication with an electrical load on board the aircraft.

It will be appreciated by those skilled in the art that although the description is provided with reference being made to example embodiments and methods of use, the present invention is not intended to be limited to these example embodiments and methods of use. Rather, the present invention is of broad scope and is intended to be limited only as set forth in the accompanying claims. Other features and advantages of the present invention will become apparent from the description, and upon reference to the drawings.

DETAILED DESCRIPTION OF THE INVENTION

Figure 1:
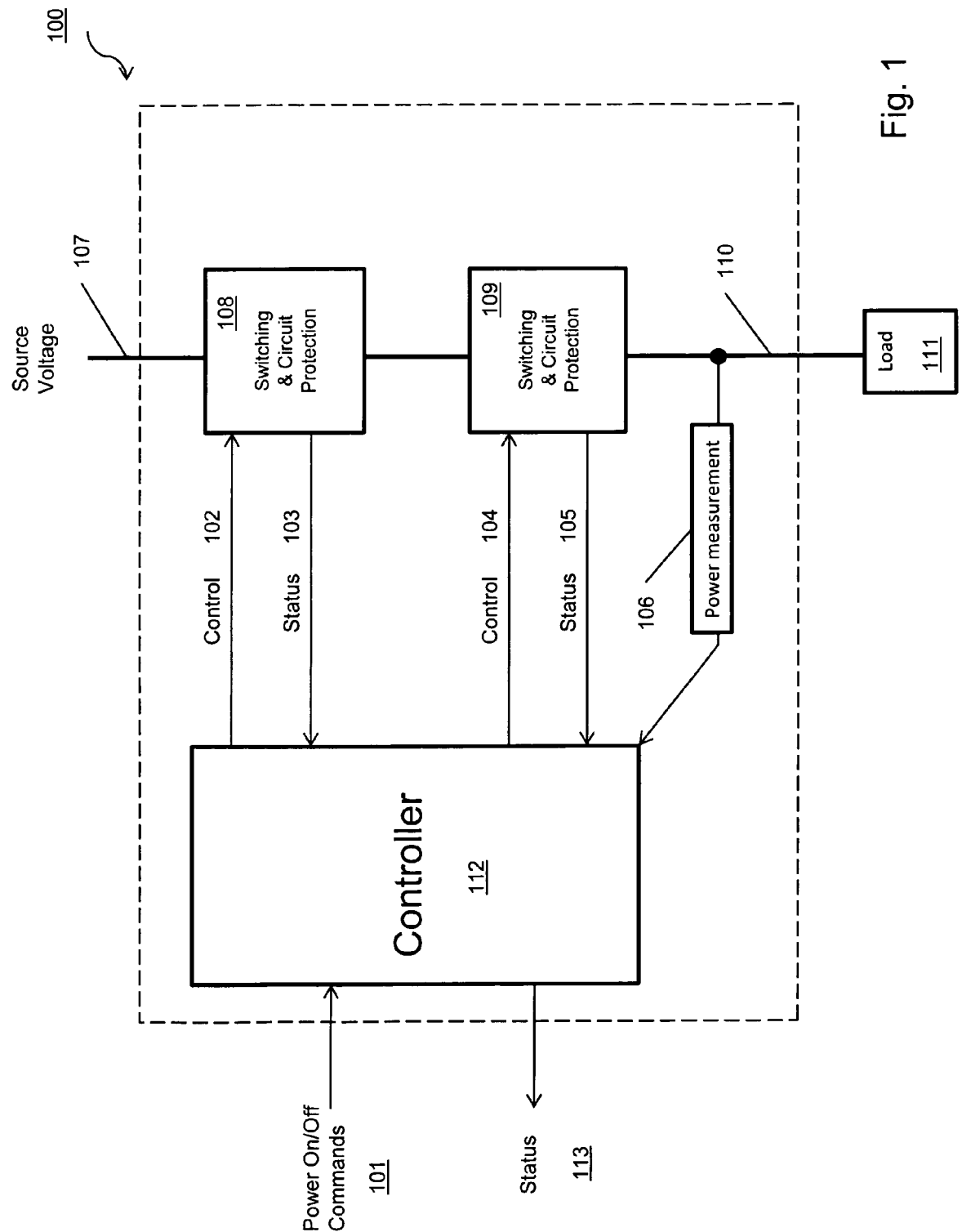
FIG. 1 is a circuit diagram of an exemplary power switching circuit of the present invention including exemplary fault detection circuits and solid-state power switches.

The present invention provides methods and apparatuses that provide for testing of power switches without requiring destructive elements such as fuses, and that allow switch integrity testing before power activation and during operation.

An example embodiment of the present invention comprises a method of testing first and second switches, wherein the first switch has first and second terminals and a control input, and wherein the second switch has first and second terminals and a control input, and wherein the second terminal of the first switch is in communication with the first terminal of the second switch, and wherein the first terminal of the first switch is adapted to be placed in communication with a power supply, and wherein the second terminal of the second switch is adapted to be placed in communication with a load, using a controller that is in communication with the control input of the first switch and the control input of the second switch, comprising the following steps performed in any order: (a) Causing the controller to direct the first switch to open and to direct the second switch to close; and causing the controller to sense the presence of power at the second terminal of the second switch, and, if power is present at the second terminal of the second switch, to indicate a fault; and (b) Causing the controller to direct the second switch to close, and causing the controller to direct the first switch to open; and causing the controller to sense the presence of power at the second terminal of the second switch, and, if power is present at the second terminal of the second switch, to indicate a fault. Such an example can further comprise causing the controller to direct the first switch to close and to direct the second switch to close, and causing the controller to sense power at the second terminal of the second switch and, if power is not present, to indicate a fault.

An example embodiment of the present invention can comprise a method of testing first and second switches, wherein the first switch has first and second terminals and a control input and a status output, and wherein the second switch has first and second terminals and a control input, and wherein the second terminal of the first switch is in communication with the first terminal of the second switch, and wherein the first terminal of the first switch is adapted to be placed in communication with a power supply, and wherein the second terminal of the second switch is adapted to be placed in communication with a load, using a controller that is in communication with the control input of the first switch and the control input of the second switch and the status output of the first switch, comprising the following steps performed in any order: (a) Causing the controller to direct the first switch to open and to direct the second switch to close; and causing the controller to sense the presence of power at the second terminal of the second switch, and, if power is present at the second terminal of the second switch, to indicate a fault; (b) Causing the controller to direct the second switch to close, and causing the controller to direct the first switch to open; and causing the controller to sense the presence of power at the second terminal of the second switch, and, if power is present at the second terminal of the second switch, to indicate a fault; and (c) Causing the controller to sense the status output of the first switch and, if a fault is indicated by the status output of the first switch, to indicate a fault. Such an example embodiment, where the second switch has a status output, and where the controller is in communication with the status output of the second switch, can further comprise causing the controller to sense the status output of the second switch and, if a fault is indicated by the status output of the second switch, to indicate a fault. Such an example embodiment can further comprise causing the controller to direct the first switch to close and to direct the second switch to close, and causing the controller to sense power at the second terminal of the second switch and, if power is not present, to indicate a fault.

An example embodiment of the present invention can comprise a method of controlling power communication from a power supply to a load, comprising: (a) Providing a first switch; (b) Providing a second switch, wherein the first and second switches are connected in series between the power supply and the load; (c) Accepting an input indicating that power is to be communicated to the load; (d) Closing the first switch and opening the second switch, and, if power is present at the load, indicating a fault; (e) Opening the first switch and closing the second switch, and, if power is present at the load, indicating a fault; (f) Closing the first switch and closing the second switch, and, if power is not present at the load, indicating a fault. Such an example embodiment, where the first switch has a status output, and where the second switch has a status output, can further comprise indicating a fault if the status output of the first switch indicates a fault or if the status output of the second switch indicates a fault. Such an example embodiment can further comprise accepting an input indicating that power is not to be communicated to the load, opening the first switch and opening the second switch, and, if power is present at the load, indicating a fault.

An example embodiment of the present invention can comprise a power switching apparatus with integrity testing, comprising: (a) A first power switch, having first and second terminals and a control input, capable of communicating power from the first terminal to the second terminal responsive to a signal on the control input, with the first terminal of the first switch adapted to be placed in communication with a power supply; (b) A second power switch, having first and second terminals and a control input, capable of communicating power from the first terminal to the second terminal responsive to a signal on the control input, with the first terminal of the second switch in communication with the second terminal of the first switch, and with the second terminal adapted to be placed in communication with a load; (c) A controller, in communication with the control input of the first switch and with the control input of the second switch, and adapted to test the integrity of the first and second switches using the methods described herein. Such an example embodiment can include the controller having an input terminal, and initiating the integrity test responsive to a signal on the control input directing the controller to perform an integrity test. Such an example embodiment can include an embodiment where the controller has an input terminal, and initiates the integrity test responsive to a signal on the control input directing the controller to place the power supply in communication with the load, and performs the integrity test before placing the power supply in communication with the load.

An example embodiment of the present invention can comprise a power switching apparatus with integrity testing, comprising: (a) A first power switch, having first and second terminals and a control input and a status output, capable of communicating power from the first terminal to the second terminal responsive to a signal on the control input, with the first terminal of the first switch adapted to be placed in communication with a power supply; (b) A second power switch, having first and second terminals and a control input, capable of communicating power from the first terminal to the second terminal responsive to a signal on the control input, with the first terminal of the second switch in communication with the second terminal of the first switch, and with the second terminal adapted to be placed in communication with a load; (c) A controller, in communication with the control input of the first switch and with the control input of the second switch and with the status output of the first switch, and adapted to test the integrity of the first and second switches using the methods described herein.

An example embodiment of the present invention can comprise a power switching apparatus with integrity testing, comprising: (a) A first power switch, having first and second terminals and a control input and a status output, capable of communicating power from the first terminal to the second terminal responsive to a signal on the control input, with the first terminal of the first switch adapted to be placed in communication with a power supply; (b) A second power switch, having first and second terminals and a control input and a status output, capable of communicating power from the first terminal to the second terminal responsive to a signal on the control input, with the first terminal of the second switch in communication with the second terminal of the first switch, and with the second terminal adapted to be placed in communication with a load; (c) A controller, in communication with the control input of the first switch and with the control input of the second switch and with the status output of the first switch, and adapted to test the integrity of the first and second switches using the methods described herein.

Several of the example embodiments can include an embodiment where the first and second switches comprise a MOSFET with built-in circuit protection. Several of the example embodiments can include an embodiment where the controller comprises a microprocessor. Such an example embodiment can include an embodiment where the first and second switches comprise a MOSFET with built-in circuit protection. Several of the example embodiments can include an embodiment where the controller comprises a microprocessor. Several of the example embodiments can include an embodiment where a predetermined amount of time is allowed to elapse after directing the first or second switch to open before causing the controller to sense the presence of power at the second terminal of the second switch.

An example embodiment of the present invention can comprise an aircraft power switching apparatus, comprising a power switch apparatus as described herein, in communication with an electrical power source on board the aircraft, and in communication with an electrical load on board the aircraft.

The present invention can provide a fault detection circuit that can check each of two or more power switches as desired, e.g., at each power cycle, for correct operation. Solid-state switches and fault detection feedback circuitry can be realized using off-the-shelf components known to those skilled in the art. If a power switch fails in a closed state, then an alert can be given. In an example apparatus according to the present invention, two solid-state switches and fault detection circuits are provided, and connected in series such that, when both switches are closed, an input power source can be coupled to an output load. A command signal can be accepted by a controller, which command signal indicates whether the input power source is to be communicated to the output load. Individual control signals regulating the conduction state of the control switches can be provided by the controller, which can also sense output status signals from the switches, and can sense power (e.g., voltage) at a terminal in communication with an output load. The invention can comprise other switch types, and systems with more switches, with the corresponding apparatus or method adapted accordingly. The invention can also be applied to parallel switch configurations, although the integrity testing method will test for complementary faults to the series configuration (e.g., "failed open" instead of "failed closed"). The description below uses a two switch, series-connected configuration for ease of illustration; those skilled in the art will appreciate modifications corresponding to other numbers of switches and other switch configurations.

In this description, a "power supply" or "power source" can comprise any source of energy that is desired to controllably deliver to a load, including as examples an electrical power supply, a DC electrical power supply, an AC electrical power supply, and a source of power useful for diagnostic purposes. A "load" can be any device or system that consumes or accepts power from a power source, including as examples electric motors, electrical displays or indicators, electrical actuators such as solenoids, and test instruments that indicate the presence of power and switches or other systems that control or direct power to loads. To "sense power" (or similar terms) can comprise, as examples, sensing voltage, sensing current, sensing whether one of the preceding is above or below a threshold, sensing whether one of the preceding has passed above or below a threshold after a predetermined time, sensing a rate or direction or frequency of change of one of the preceding, and combinations thereof.

The present invention can also provide a method for testing the integrity of switches, using any of a variety of apparatuses such as those described herein.

FIG. 1 is circuit diagram of an example power switching and protection apparatus according to the present invention 100. The example apparatus comprises a first terminal 107 adapted to be placed in an operative relationship with a power supply, a second terminal 110 adapted to be placed in an operative relationship with a load 111, a logic controller 112 adapted to implement functions such as those described below, and first 108 and second 109 power switches (each of which can have its own circuit protection and fault detection capability). The first terminal 107 can be adapted to connect to a AC or DC power source, or other type of power source suitable for connection via the apparatus 100 to a load.

The controller 112 can accept commands via an input port 101 adapted to receive commands specifying whether power from the first terminal 107 is to be communicated to the second terminal 110, and can communicate status of the apparatus 100 via an output port 113. The input port 101 and output port 113 can comprise analog lines; wired, wireless, or optical digital communication channels; or other communication mechanisms known to those skilled in the art. The controller 112 can, for example, be realized using discrete circuitry, one or more microprocessors, field programmable gate arrays or logic devices, input/output circuits, or combinations of those.

The controller 112 can communicate commands 102 to the first power switch 108 and receive status information 103 from the first power switch 108, via analog lines; wired, wireless, or optical digital communication channels; or other communication mechanisms known to those skilled in the art. The controller 112 can communicate commands 104 to the second power switch 109 and receive status information 105 from the second power switch 109, via analog lines; wired, wireless, or optical digital communication channels; or other communication mechanisms known to those skilled in the art. Note that status information from the power switches is not required in all embodiments of the present invention, but the invention can make use of such information if the power switches chosen provide such capability. The power switches can be mechanical relays or solid-state switches, for example switches based on MOSFET technology. The circuit protection can be any type protection that provides short circuit and over-current protection, including fuses or of re-settable solid-state protection. Status indication from the switches is not required for use with the present invention, but the present invention can make beneficial use of status indications if they are available. The switches can also comprise a form of integrated circuit that contains solid-state switches with integral circuit protection.

The controller 112 is also in a sensing relationship with the second terminal 110, allowing the controller 112 to determine whether power is supplied by the apparatus 100 to the second terminal 110. As an example, the controller 112 can have a voltage sensing capability in electrical communication with the second terminal 110.

The controller 112 can test the integrity of the power switches 108, 109 in response to a command 101 to test, a command 101 to activate the switches 108, 109 (communicating power from the first terminal 107 to the second terminal 110), a predetermined time interval, or an external event or signal (not shown). To test the integrity of the first 108 and second 109 switches, the controller 112 can close the second switch 109 via control line 104, and open the first switch 108 via control line 102. "Close" refers to a state where the switch is communicating power between its terminals; "Open" refers to a state where the switch is not communicating power between its terminals. Controller 112 can check for power, e.g., voltage, at the second terminal 110. If the controller 112 determines that power is present at the second terminal 110, then the controller can determine that the first switch 108 has failed in a "closed" state, and is not responsive to direction to open. The controller 112 can indicate that failure, and can open the second switch 109 if power is not desired at the second terminal 110. The failure indication can be communicated using the status line 113 to whatever type of display, annunciator, or indicator is appropriate for the implementation.

If, however, the controller 112 determines that no power is present at the second terminal 110, then the controller 112 can determine that the first switch has not failed in a closed state. The controller 112 can then open the second switch 109 and close the first switch 108. The controller 112 can check for power at the second terminal 110 and, if present, determine that the second switch 109 has failed in a closed state. The controller 112 can indicate that failure, and can open the first switch 108 if power is not desired at the second terminal 110. The failure indication can be communicated using the status line 113 to whatever type of display, annunciator, or indicator is appropriate for the implementation.

When it is desired that the apparatus 110 communicate power from the first terminal 107 to the second terminal 110, the controller 112 can, in some applications, first check the integrity of the first 108 and second 109 switches. The controller 112 can close the first 108 and second 109 switches. The controller 112 can determine whether power is present at the second terminal 110. If not, then the controller can determine that one of the two switches 108, 109 has failed in an open state (assuming the power supply has properly supplied power to the first terminal 107, which can also be monitored by the controller 112 in some applications). The controller 112 can indicate that failure, and can open the first and second switch 108 if power is not desired at the second terminal 110. The failure indication can be communicated using the status line 113 to whatever type of display, annunciator, or indicator is appropriate for the implementation.

When it is desired that the apparatus 110 not communicate power from the first terminal 107 to the second terminal 110, the controller 112 can open the first 108 and second 109 switches. If the controller 112 determines that power is present at the second terminal 110 when both the first 108 and second 109 switches are opened, then the controller can determine that both of the switches have failed in a closed state (or the apparatus has failed in another manner with the same effect). The controller 112 can indicate that failure. The failure indication can be communicated using the status line 113 to whatever type of display, annunciator, or indicator is appropriate for the implementation. A manually-operable switch, such as a circuit breaker, can be provided in some applications to allow power to the load to be manually interrupted in a scenario where both switches have failed in closed states.

The controller 112 can also indicate failures indicated by status 103, 105 communications from the switches, if such capability is provided by the switches.

The detection of power at the second terminal 110 by the controller 112 can be accommodated in various ways. As an example, the controller 112 can have a voltage sensing capability in electrical communication with the second terminal 110. The voltage sensing capability can be mounted with the controller 112, or can be mounted near the second terminal 110, depending on the application. The voltage sensing capability can provide an indication of the voltage present at the second terminal 110, or can provide a signal if the voltage at the second terminal 110 is above or below a threshold value. Delays in making the power determination can be provided if the application indicates; for example if the load characteristics do not allow full voltage to be developed for some time after power is applied to the load. As another example, the controller 112 can have a current sensing capability in electrical communication with the second terminal 111. As another example, the controller 112 can indirectly sense power at the second terminal 110, for example by sensing operation of a device comprising the load (e.g., a light being activated) or the results of activation of the load (e.g., position of an electrically actuated element).

Figure 2:
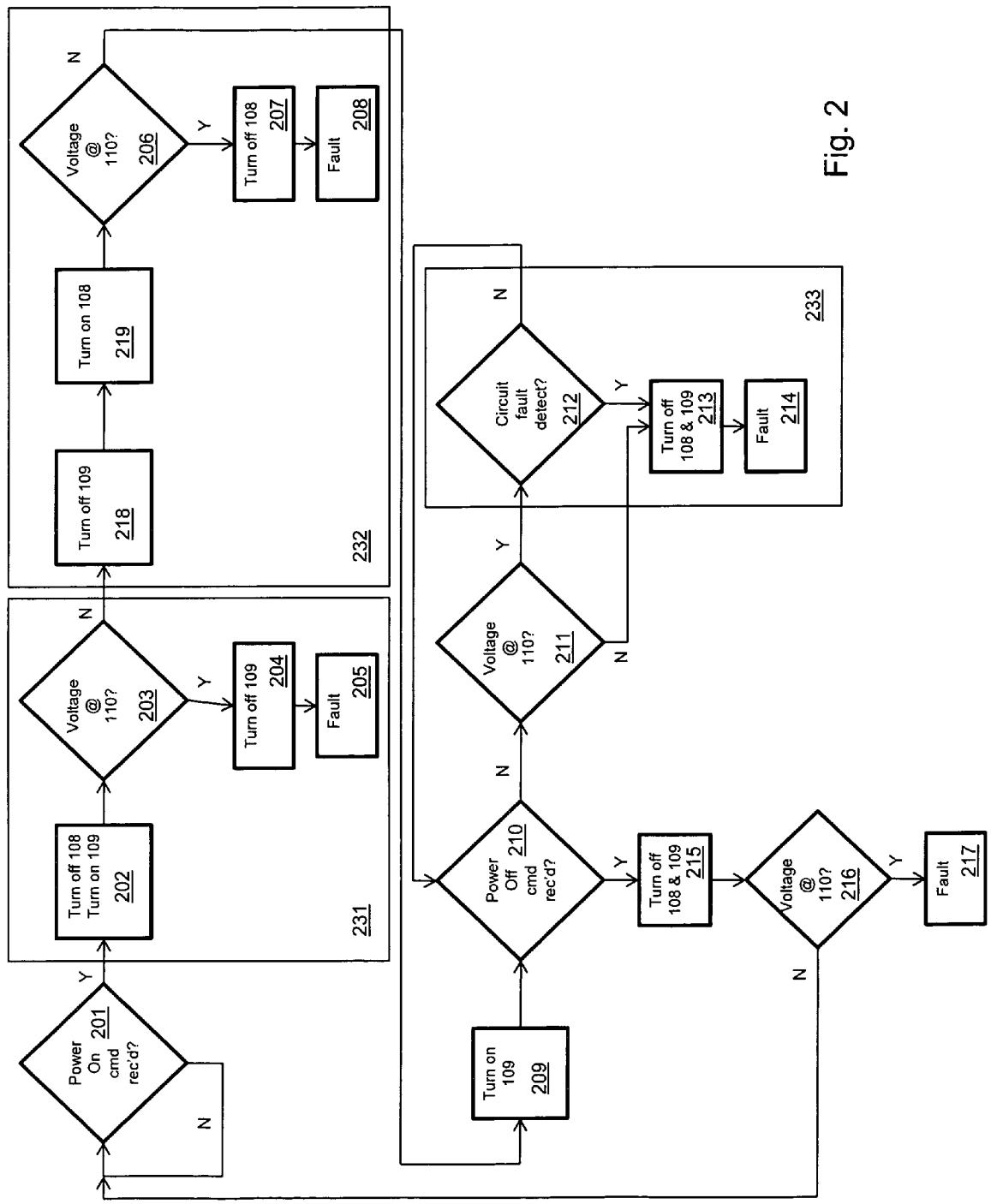
FIG. 2 is an illustration of a process diagram of control of an example embodiment of the present invention.

FIG. 2 is an illustration of a process diagram of control of an example method according to the present invention. Methods according to the present invention can be practiced with a variety of hardware systems. For convenience of reference, the description of the example method refers to the elements of FIG. 1, although the example method, and other methods according to the present invention, are not limited to that example apparatus.

The example embodiment of FIG. 2 assumes that an integrity check is to be performed responsive to receipt of a "power on" command (indicating that it is desired for power to be communicated to a load), and that the presence of power to the load is to be monitored so long as that command is active. Subsets of the method illustrated in FIG. 2 can be useful; e.g., just the integrity test (subsets 231 and 232) can be useful in response to a "test now" command, or on periodic timing, or in response to an external condition. Also, the method (or subsets) can be initiated responsive to other conditions, such as a "test now" command, a periodic test interval, or an external condition (e.g., an emergency or diagnostic condition signal).

Description of the method begins in state 201, where the method awaits a "power on" command. When a "power on" command is received, switch 108 is opened and switch 109 is closed 202. The power (e.g., voltage) at the second terminal 110 is checked 203 (e.g., by one of the techniques described in connection with FIG. 1), and if power is present then switch 109 is opened 204 and a fault indicated 205.

If power is not present at the second terminal 110, the switch 109 is opened 218 and switch 108 is closed 219. The power (e.g., voltage) at the second terminal 110 is checked 206 (e.g., by one of the techniques described in connection with FIG. 1), and if power is present then switch 108 is opened 207 and a fault indicated 208. Note that the two test steps 231 and 232 can be performed in alternate order (i.e., 232 performed first, then 231), and only one can be performed if it is desired to test only one of the two switches at this time.

If power is not present at the second terminal 110, then switch 109 is closed 209. If a "power off" command is not received 210, then the power at the second terminal 110 is checked 211. If there is no power at the second terminal 211, the switches 108, 109 are opened 213, and a fault indicated 214. If power is detected at the second terminal 110, and one of the switches 108, 109 indicates that a fault has occurred 212, the switches 108, 109 are opened 213 and a fault indicated 214. Note that the switch internal fault signals can be sensed and an appropriate response generated 233 at various times in the process, or at multiple times in the process, or continuously during the process; the placement at the end of the illustration in FIG. 2 is for convenience of description only. The internal fault signal sensing 233 can be deleted if, for example, the switches do not supply such signals or such signals are not important in determining the integrity of the switch system.

If a "power off" command is received 210, the switches 108, 109 are opened 215. The power at the second terminal 110 is checked 216. If there is power sensed at the second terminal, then a fault is indicated 217. If there is no power sensed at the second terminal 110, then the method waits until either power is sensed 216 or a "power on" command is received 201.

The particular sizes and equipment discussed above are cited merely to illustrate particular embodiments of the invention. It is contemplated that the use of the invention can involve components having different sizes and characteristics. It is intended that the scope of the invention be defined by the claims appended hereto.

We claim:

1. A method of testing first and second switches, wherein the first switch has first and second terminals and a control input, and wherein the second switch has first and second terminals and a control input, and wherein the second terminal of the first switch is in communication with the first terminal of the second switch, and wherein the first terminal of the first switch is adapted to be placed in communication with a power supply, and wherein the second terminal of the second switch is adapted to be placed in communication with a load, using a controller that is in communication with the control input of the first switch and the control input of the second switch, comprising the following steps performed in any order: a) causing the controller to direct the first switch to open and to direct the second switch to close; and causing the controller to sense the presence of power at the second terminal of the second switch, and, if power is present at the second terminal of the second switch, to indicate a fault; b) causing the controller to direct the first switch to close, and causing the controller to direct the second switch to open; and causing the controller to sense the presence of power at the second terminal of the second switch, and, if power is present at the second terminal of the second switch, to indicate a fault.

2. A method as in claim 1, further comprising causing the controller to direct the first switch to close and to direct the second switch to close, and causing the controller to sense power at the second terminal of the second switch and, if power is not present, to indicate a fault.

3. A power switching apparatus with integrity testing, comprising: a) a first power switch, having first and second terminals and a control input, capable of communicating power from the first terminal to the second terminal responsive to a signal on the control input, with the first terminal of the first switch adapted to be placed in communication with a power supply; b) a second power switch, having first and second terminals and a control input, capable of communicating power from the first terminal to the second terminal responsive to a signal on the control input, with the first terminal of the second switch in communication with the second terminal of the first switch, and with the second terminal adapted to be placed in communication with a load; c) a controller, in communication with the control input of the first switch and with the control input of the second switch, and configured to test the integrity of the first and second switches applying the method of claim 1.

4. An apparatus as in claim 3, wherein the controller has an input terminal, and initiates the integrity test responsive to a signal on the input terminal directing the controller to perform an integrity test.

5. An apparatus as in claim 3, wherein the controller has an input terminal, and initiates the integrity test responsive to a signal on the input terminal directing the controller to place the power supply in communication with the load, and performs the integrity test before placing the power supply in communication with the load.

6. An apparatus as in claim 3, wherein the first and second switches comprise a MOSFET with built-in circuit protection.

7. An apparatus as in claim 3, wherein the controller comprises a microprocessor or a field programmable logic device.

8. An aircraft power switching apparatus, comprising a power switch apparatus as in claim 3, in communication with an electrical power source on board the aircraft, and in communication with an electrical load on board the aircraft.

9. A method as in claim 1, wherein a predetermined amount of time is allowed to elapse after directing the first or second switch to open before causing the controller to sense the presence of power at the second terminal of the second switch.

10. A method of testing first and second switches, wherein the first switch has first and second terminals and a control input and a status output, and wherein the second switch has first and second terminals and a control input, and wherein the second terminal of the first switch is in communication with the first terminal of the second switch, and wherein the first terminal of the first switch is adapted to be placed in communication with a power supply, and wherein the second terminal of the second switch is adapted to be placed in communication with a load, using a controller that is in communication with the control input of the first switch and the control input of the second switch and the status output of the first switch, comprising the following steps performed in any order: a) causing the controller to direct the first switch to open and to direct the second switch to close; and causing the controller to sense the presence of power at the second terminal of the second switch, and, if power is present at the second terminal of the second switch, to indicate a fault; b) causing the controller to direct the first switch to close, and causing the controller to direct the second switch to open; and causing the controller to sense the presence of power at the second terminal of the second switch, and, if power is present at the second terminal of the second switch, to indicate a fault; c) causing the controller to sense the status output of the first switch and, if a fault is indicated by the status output of the first switch, to indicate a fault.

11. A method as in claim 10, wherein the second switch has a status output, and wherein the controller is in communication with the status output of the second switch, wherein the method further comprises causing the controller to sense the status output of the second switch and, if a fault is indicated by the status output of the second switch, to indicate a fault.

12. A power switching apparatus with integrity testing, comprising: a) a first power switch, having first and second terminals and a control input and a status output, capable of communicating power from the first terminal to the second terminal responsive to a signal on the control input, with the first terminal of the first switch adapted to be placed in communication with a power supply; b) a second power switch, having first and second terminals and a control input and a status output, capable of communicating power from the first terminal to the second terminal responsive to a signal on the control input, with the first terminal of the second switch in communication with the second terminal of the first switch, and with the second terminal adapted to be placed in communication with a load; c) a controller, in communication with the control input of the first switch and with the control input of the second switch and with the status output of the first switch, and configured to test the integrity of the first and second switches applying the method of claim 4.

13. An apparatus as in claim 12, wherein the first and second switches comprise a MOSFET with built-in circuit protection.

14. An apparatus as in claim 12, wherein the controller comprises a microprocessor or a field programmable logic device.

15. A method as in claim 10, further comprising causing the controller to direct the first switch to close and to direct the second switch to close, and causing the controller to sense power at the second terminal of the second switch and, if power is not present, to indicate a fault.

16. A power switching apparatus with integrity testing, comprising: a) a first power switch, having first and second terminals and a control input and a status output, capable of communicating power from the first terminal to the second terminal responsive to a signal on the control input, with the first terminal of the first switch adapted to be placed in communication with a power supply; b) a second power switch, having first and second terminals and a control input, capable of communicating power from the first terminal to the second terminal responsive to a signal on the control input, with the first terminal of the second switch in communication with the second terminal of the first switch, and with the second terminal adapted to be placed in communication with a load; c) a controller, in communication with the control input of the first switch and with the control input of the second switch and with the status output of the first switch, and configured to test the integrity of the first and second switches applying the method of claim 3.

17. An apparatus as in claim 16, wherein the first and second switches comprise a MOSFET with built-in circuit protection.

18. An apparatus as in claim 16, wherein the controller comprises a microprocessor or a field programmable logic device.

19. A method of controlling power communication from a power supply to a load, comprising: a) providing a first switch; b) providing a second switch, wherein the first and second switches are connected in series between the power supply and the load; c) accepting an input indicating that power is to be communicated to the load; d) closing the first switch and opening the second switch, and, if power is present at the load, indicating a fault; e) opening the first switch and closing the second switch, and, if power is present at the load, indicating a fault; f) closing the first switch and closing the second switch, and, if power is not present at the loads indicating a fault.

20. A method as in claim 19, wherein the first switch has a status output, and wherein the second switch has a status output, and further comprising indicating a fault if the status output of the first switch indicates a fault or if the status output of the second switch indicates a fault.

21. A method as in claim 19, further comprising accepting an input indicating that power is not to be communicated to the load, opening the first switch and opening the second switch, and, if power is present at the load, indicating a fault.

* * * * *